United States Patent
Enomoto et al.

(10) Patent No.: US 7,038,317 B2
(45) Date of Patent: May 2, 2006

(54) SEMICONDUCTOR DEVICE AND METHOD OF MANUFACTURING SAME

(75) Inventors: Yoshiyuki Enomoto, Kanagawa (JP); Keishi Inoue, Kanagawa (JP)

(73) Assignee: Sony Corporation, (JP)

( * ) Notice: Subject to any disclaimer, the term of this patent is extended or adjusted under 35 U.S.C. 154(b) by 0 days.

(21) Appl. No.: 10/487,440

(22) PCT Filed: Jul. 8, 2003

(86) PCT No.: PCT/JP03/08661

§ 371 (c)(1),
(2), (4) Date: Feb. 23, 2004

(87) PCT Pub. No.: WO2004/006328

PCT Pub. Date: Jan. 15, 2004

(65) Prior Publication Data

US 2004/0219782 A1    Nov. 4, 2004

(30) Foreign Application Priority Data

Jul. 9, 2002    (JP) .............................. 2002-199570

(51) Int. Cl.
*H01L 23/48* (2006.01)
*H01L 23/52* (2006.01)
(52) U.S. Cl. ..................... 257/758; 257/773; 438/638
(58) Field of Classification Search ............... 438/638; 257/758, 775, 786, 773
See application file for complete search history.

(56) References Cited

U.S. PATENT DOCUMENTS 5,416,431 A    5/1995    Strauss
6,271,548 B1 *    8/2001    Umemoto et al. .......... 257/202
6,528,411 B1 *    3/2003    Kakuhara ................... 438/627

FOREIGN PATENT DOCUMENTS

| EP | 1 102 182 A2 | 5/2001 |
|----|--------------|--------|
| EP | 1102182 A2 * | 5/2001 |
| JP | 5-190687 A | 7/1993 |

(Continued)

OTHER PUBLICATIONS

IBM Tech. Discl. Bull. vol. 19, No. 3, pp. 878-882(Aug. 1, 1976).*

(Continued)

*Primary Examiner*—Caridad Everhart
(74) *Attorney, Agent, or Firm*—Rader, Fishman & Grauer PLLC; Ronald P. Kananen

(57) ABSTRACT

Disclosed is a semiconductor device which has a wiring structure including a small-width wiring connected to a large-width wiring through a connection hole or holes formed in an inter-layer insulation film and in which reliability of wiring can be enhanced by regulating the number of the connection hole or holes and the location(s) of the connection hole or hole. The semiconductor device includes first wirings (21), (22), an inter-layer insulation film (not shown) covering the first wirings (21), (22), second wirings (31), (33) connected to the first wirings (21), (22) through the connection holes formed in the inter-layer insulation film, the first wirings (21), (22) being formed to be larger in width than the second wirings (31), (33), wherein a plurality of the connection holes (41), (42) and connection holes (43) to (45) are provided, and the plurality of the connection holes (41), (42), (43) to (45) are disposed at intervals between the connection holes (41), (42) and between the connection holes (43) to (45) within the range of from 1 to 18 times the connection hole diameter.

12 Claims, 14 Drawing Sheets

FOREIGN PATENT DOCUMENTS

| | | |
|---|---|---|
| JP | 10-214893 A | 8/1998 |
| JP | 2000-68383 A | 3/2000 |
| JP | 2002-124565 A | 4/2002 |

OTHER PUBLICATIONS

International Search Report Oct. 14, 2003.

* cited by examiner

AREA WHERE CU IS LOST

AREA WHERE CU IS LOST

SEMICONDUCTOR DEVICE AND METHOD OF MANUFACTURING SAME

TECHNICAL FIELD

The present invention relates to a semiconductor device including a multi-layer wiring, and particularly to a semiconductor device including a multi-layer wiring in which a large-width wiring and a small-width wiring are connected between different wiring layers.

BACKGROUND ART

The number of connection holes for connection between different wiring layers is determined according to the widths of the wirings to be connected and the current to be passed through the wiring formed in the connection holes. However, in the case where a large-width wiring (for example, a wiring not less than 1 μm in width) and a small-width wiring (for example, a wiring about 0.14 μm in width) are connected, for example, where a small-width wiring is led out from a power supply wire for potential fixation, a single connection hole is used for the connection.

The material for forming the wiring layers and the material used for insulation between the wiring layers have come to changed to a low-resistance wiring material represented by copper (Cu) and to a low-dielectric-constant insulating material represented by polyaryl ether-based resins (for example, FLARE produced by Allied Signal, SiLK produced by Dow Chemical, VE produced by Schumacher, and the like are known), silicon oxycarbide (SiOC) and the like, for coping with the wiring delay arising from scale-down of wiring pitch.

In addition, it has been reported that Cu as a low-resistance material is more excellent in electro-migration resistance than aluminum (Al) which has been widely used as a wiring material. In the case of forming a small-width wiring by use of Cu, however, it is difficult to use a dry etching method, since there has not been found any dry etching gas suitable for etching Cu at a high selectivity ratio relative to the insulating film serving as a base material. Therefore, it is a general practice to form a buried wiring by a trench wiring method (for example, the Damascene process). Particularly, a method of filling (or burying) connection holes and a wiring layer simultaneously (for example, the dual Damascene process) is considered to be a promising method from the viewpoints of enlarging the register margin in lithography and shortening the processing steps.

As has been mentioned above, the wiring material has been changed from Al to Cu. As shown in FIG. 12, by using a pattern in which a single connection hole 125 was provided for connecting a small-width wiring 123 to a large-width wiring 121 satisfying the relationship of (wiring width)/(connection hole diameter)≧7 and a single connection hole 126 was provided for connecting a small-width wiring 124 to a large-width wiring 122 satisfying the relationship of (wiring width)/(connection hole diameter)≧7, a high-temperature standing test (the specimen was left to stand at 225° C. for 500 hr) as a wiring reliability evaluation was carried out.

As a result of analysis of a defective portion upon the test, losing of Cu was confirmed on the side of the large-width wiring 121 beneath the connection hole 125, as shown in FIG. 13. In addition, as shown in FIG. 14, a similar phenomenon was confirmed also in the case where the large-width wiring 121 was disposed on the upper side of the connection hole 125; in this case, losing of Cu was generated in the inside of the connection hole 125. The mechanism of these defects has not yet been elucidated. It is supposed, however, that under the influences of a stress due to a difference in thermal expansion coefficient between the wiring and the insulating film and a stress of the insulating film itself, migration of Cu was caused at the wiring beneath the connection hole, resulting in the losing of Cu. Besides, in view of the fact that dependency on wiring width is seen, it is considered that the phenomenon was caused also by the influence of volumetric shrinkage attendant on crystal growth at the wiring.

DISCLOSURE OF INVENTION

The present invention pertains to a semiconductor device which has been devised in order to solve the above-mentioned problems in the related art.

In accordance with the present invention, there is provided a semiconductor device including a first wiring, an inter-layer insulation film covering the first wiring, a connection hole or holes formed in the inter-layer insulation film so as to reach the first wiring, and a second wiring connected to the first wiring through the connection hole or holes, the first wiring or the second wiring being formed to be larger in width than the other wiring, wherein a plurality of the connection holes are provided. The plurality of the connection holes are so disposed that the spacing between the connection holes is in the range of 1 to 18 times the diameter of the connection holes.

In the above semiconductor device, the first wiring or the second wiring is formed to be larger in width than the other wiring, but the provision of the plurality of connection holes lowers the defect generation probability. This is because the increase in the number of connection holes ensures that where, for example, two connection holes are used for connection between the wirings, breakage of electric conduction would not be generated unless defects are generated simultaneously at the two connection holes. Thus, the provision of a plurality of connection holes is effective for preventing the breakage trouble.

Where a plurality of connection holes are provided, it is desired that the connection holes are disposed within a predetermined interval. FIG. 9 shows the defect generation rate (hereinafter referred to as fraction defective) upon a high-temperature standing test (the specimen is left to stand at 225° C. for 500 hr) against the ratio of the connection hole interval to the connection hole diameter. It is seen that where the plurality of connection holes are disposed at a connection hole interval within the range of from 1 to 18 times the connection hole diameter, as shown in FIGS. 8A and 8B, the fraction defective is zero (0). In view of this, it is desirable that the plurality of connection holes are disposed at a connection hole interval within the range of from 1 to 18 times the connection hole diameter.

In accordance with the present invention, there is provided a semiconductor device including a first wiring, an inter-layer insulation film covering the first wiring, a connection hole or holes formed in the inter-layer insulation film so as to reach the first wiring, and a second wiring connected to the first wiring through the connection hole or holes, the first wiring or the second wiring being formed to be larger in width than the other wiring, wherein the minimum required number of the connection hole or holes formed is one where W/V<7, is two where 7≦W/V<70, and is three where 70≦W/V, where W is the width of the large-width wiring, and V is the connection hole diameter.

In the above semiconductor device, the volumetric shrinkage portions of volumetric shrinkage due to crystal growth at the wiring, which is considered to be a cause of the defect to be solved by the present invention, is considered to be concentrated on the connection hole, but the above-described optimization of the number of the connection hole or holes makes it possible to absorb the volumetric shrinkage amount (which depends on the wiring width), and the number of the connection hole or holes required for conduction is found out.

FIG. 10 shows the relationship between the ratio of wiring width to connection hole diameter (W/V) at the first wiring larger in width than the second wiring in a wiring structure formed by simultaneously filling up the connection hole or holes and wiring trenches with Cu, and the fraction defective upon a high-temperature standing test (the specimen is left to stand at 225° C. for 500 hr) taking the number of connection hole or holes as a parameter. As shown in FIG. 10, when the ratio of wiring width to connection hole diameter (W/V) exceeds 7, a defect is generated upon the high-temperature standing test where a single connection hole is provided, but the generation of the defect can be restrained by providing two connection holes. In addition, when the wiring width becomes further larger and the ratio of wiring width to connection hole diameter (W/V) exceeds 70, the defect is generated even where two connection holes are provided, but the defect can be obviated by providing three connection holes. Thus, the defect upon the high-temperature standing test can be obviated by providing a plurality of connection holes according to the wiring width.

In accordance with the present invention, there is provided a semiconductor device including a first wiring, an inter-layer insulation film covering the first wiring, a connection hole or holes formed in the inter-layer insulation film so as to reach the first wiring, and a second wiring connected to the first wiring through the connection hole or holes, the first wiring or the second wiring being formed to be larger in width than the other wiring, wherein the device includes a leader wiring formed in continuity with the large-width wiring and smaller in width than the large-width wiring, and the connection hole or holes are formed in the inter-layer insulation film so as to reach the leader wiring. The semiconductor device satisfies the relation ship of $Ws/V<7$, where $Ws$ is the width of the leader wiring, and $V$ is the connection hole diameter, and the device satisfies the relationship of $W/S<143\ \mu m^{-1}$, where $S$ is the area occupied by the leader wiring portion ranging from the large-width wiring to the location of the connection hole, and $W$ is the width of the large-width wiring satisfying the relationship of $W/V \geq 7$.

In the above semiconductor device, as a countermeasure for coping with the problem that the connection hole or hole cannot be disposed according to the wiring width, the connection hole is connected to the leader wiring portion formed in continuity with the large-width wiring and smaller in width than the large-width wiring, and, therefore, the problem which has been generated with the large-width wiring portion can be obviated. FIGS. 11A and 11B show the fraction defective upon the high-temperature standing test (the specimen is left to stand at 225° C. for 500 hr) against W/S, where W is the width of the large-width wiring, and S is the area of the leader wiring portion ranging from the large-width wiring to the location of the connection hole. The area S can be determined as $Ws \times Ls$, where $Ws$ is the width of the leader wiring portion formed in continuity with the large-width wiring and smaller in width than the large-width wiring, and $Ls$ the distance from the large-width wiring to the location of the connection hole along the leader wiring portion.

As shown in FIGS. 11A and 11B, by a setting that $W/S \leq 143\ \mu m^{-1}$, the generation of the defect can be obviated even where only one connection hole is provided. In this case, it is necessary that the width $Ws$ of the leader wiring portion smaller in width than the large-width wiring satisfies the relationship of $Ws/V<7$. The reason for this is the same as has been described above referring to FIG. 10.

In accordance with the present invention, there is provided a method of manufacturing a semiconductor device, including the steps of: forming a first wiring; forming an inter-layer insulation film on the first wiring; providing the inter-layer insulation film with a connection hole or holes reaching the first wiring; and forming on the inter-layer insulation film a second wiring connected to the first wiring through the inside of the connection hole or holes, the first wiring or the second wiring being formed to be larger in width than the other wiring, wherein a plurality of the connection holes reaching the large-width wiring are provided. The plurality of the connection holes are disposed at a connection hole interval within the range of from 1 to 8 times the connection hole diameter.

In the above method of manufacturing a semiconductor device, even through the first wiring or the second wiring is formed to be larger in width than the other wiring, the provision of the plurality of the connection holes makes it possible to manufacture a semiconductor device in which the probability of defect generation at the connection hole portions is lowered. This is because the increase in the number of connection holes ensures that where, for example, at least two connection holes are provided for connection between the wirings, breakage of electric conduction would not be generated unless defects are simultaneously generated at two connection holes. Thus, formation of a plurality of connection holes is effective for preventing the breakage trouble.

In disposing the plurality of connection holes, it is desirable to dispose the connection holes within a predetermined connection hole interval. The reason is the same as has been described above referring to FIG. 9.

In accordance with the present invention, there is provided a method of manufacturing a semiconductor device, including the steps of: forming a first wiring; forming an inter-layer insulation film on the first wiring; providing the inter-layer insulation film with a connection hole or holes reaching the first wiring; and forming on the inter-layer insulation film a second wiring connected to the first wiring through the inside of the connection hole or holes, the first wiring or the second wiring being formed to be larger in width than the other wiring, wherein the number of the connection hole or holes formed is one where $W/V<7$, is two where $7 \leq W/V<70$, and is three where $70 \leq W/V$, where W is the width of the large-width wiring, and V is the connection hole diameter.

In the above method of manufacturing a semiconductor device, the number of the connection hole or holes formed is one where $W/V<7$, is two where $7 \leq W/V<70$, and is three where $70 \leq W/V$, where W is the width of the large-width wiring, and V is the connection hole diameter. Therefore, as has been described above referring to FIG. 10, the provision of the plurality of connection holes according to the wiring width makes it possible to obviate the defect upon the high-temperature standing test.

In accordance with the present invention, there is provided a method of manufacturing a semiconductor device, including the steps of: forming a first wiring; forming an inter-layer insulation film on the first wiring; providing the inter-layer insulation film with a single connection hole reaching the first wiring; and forming on the inter-layer insulation film a second wiring connected to the first wiring through the inside of the connection hole, the first wiring or the second wiring being formed to be larger in width than the other wiring, wherein a leader wiring smaller in width than the large-width wiring is formed together with the large-width wiring in continuity with the large-width wiring, and the other wiring is formed on the inter-layer insulation film so as to be connected to the leader wiring through the inside of the connection hole. Further, the method satisfies the relationship of Ws/V<7, where Ws is the width of the leader wiring, and V is the connection hole diameter, and the method satisfies the relationship of W/S<143 $\mu m^{-1}$, where S is the area occupied by the leader wiring portion ranging from the large-with wiring to the location of the connection hole, and W is the width of the large-width wiring satisfying the relationship of W/V≧7.

In the above method of manufacturing a semiconductor device, the large-width wiring is provided with the leader wiring formed in continuity with the large-width wiring and smaller in width than the large-width wiring, and the connection hole is connected to the leader wiring portion, so that the problem which would otherwise be generated at the large-width wiring portion is obviated. In addition, since Ws/V<7 is satisfied and W/V<143 $\mu m^{-1}$ is satisfied, the fraction defective upon the high-temperature standing test against W/S becomes zero (0), as has been described above referring to FIGS. 11A and 11B.

BEST MODE FOR CARRYING OUT THE INVENTION

Figure 1:
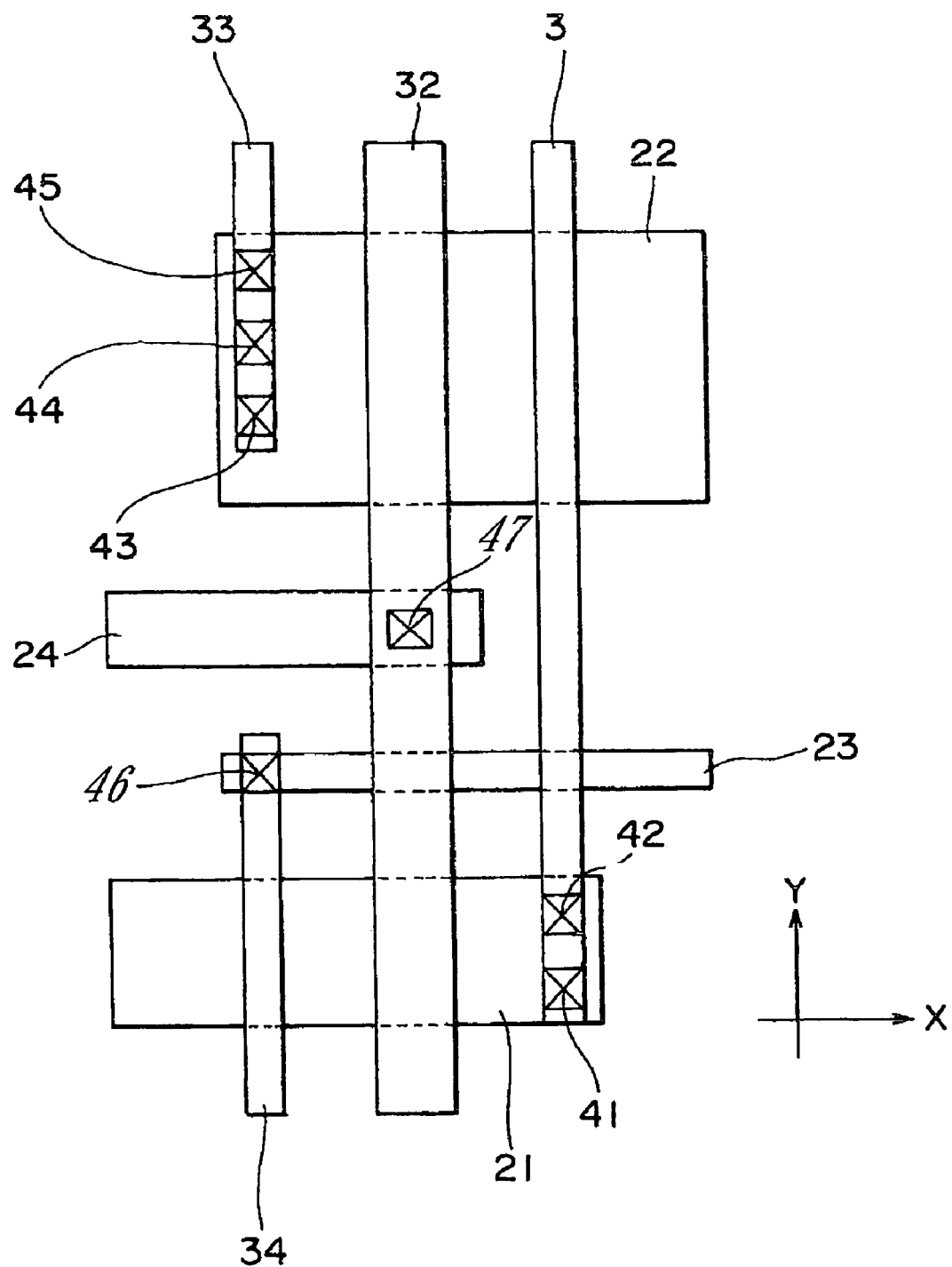
FIG. 1 is a wiring layout diagram showing a first embodiment of the semiconductor device according to the present invention.

Now, a first embodiment of the semiconductor device according to the present invention will be described, referring to a wiring layout diagram in FIG. 1. For simplicity of description, in the drawing, device regions, device isolation regions, inter-layer insulation films and the like formed in or on a silicon substrate are omitted, and only wirings are illustrated.

As shown in FIG. 1, first wirings 21, 22, 23, and 24 of a first wiring layer are formed, for example in X direction, on a silicon substrate (not shown), with an insulation film (not shown) therebetween. The first wirings 21 to 24 can be formed, for example, of copper, a copper alloy, aluminum or the like. Further, second wirings 31, 32, and 33 of a second wiring layer are formed, for example in Y direction, on the first wiring layer so as to cross the first wiring layer, with an inter-layer insulation film (not shown) therebetween. The second wirings 31 to 33 can be formed, for example, of copper, a copper alloy, aluminum or the like.

In addition, the inter-layer insulation film formed between the first wiring layer and the second wiring layer is provided with connection holes 41 and 42 for connection between the first wiring 21 and the second wiring 31, is provided with connection holes 43, 44, and 45 for connection between the first wiring 22 and the second wiring 33, is provided with a connection hole 46 for connection between the first wiring 23 and the second wiring 34, and is provided with a connection hole 47 for connection between the first wiring 24 and the second wiring 32. Each of the connection holes 41 to 47 is provided therein with an electrically conductive connection portion. Each of the connection holes 41 to 47 may be formed integrally with the relevant wiring, or may be formed separately from the relevant wiring. Here, each connection hole is assumed to be formed integrally with the relevant second wiring. Therefore, the connection portions are formed of a material similar to that of the second wirings.

The first wirings 21 and 22 satisfy the relationship 7≦W1/V, where W1 is the width of the first wirings, and V is the connection hole diameter, whereas the first wirings 23 and 24 satisfy the relationship W1/V<7, where W1 is the width of the first wirings, and V is the connection hole diameter. The second wirings 31, 32, and 33 satisfy the relationship W2/V<7, where W2 is the width of the second wirings, and V is the connection hole diameter.

The plurality of the connection holes 41 and 42 are so disposed that the interval between the connection holes 41 and 42 is within the range of from 1 to 18 times the connection hole diameter V. Similarly, the connection holes 43, 44, and 45 are also so disposed that the interval therebetween is within the range of from 1 to 18 times the connection hole diameter V.

The minimum required number of the connection holes for the first wirings is one where W/V<7, is two where 7≦W/V<70, and is three where 70≦W/V, where W is the width of the first wiring, and V is the connection hole diameter.

In the above semiconductor device, although the first wiring 21 is larger in width than the second wiring 31 and the first wiring 22 is larger in width than the second wiring 33, the provision of the plurality of the connection holes 41 to 45 leads to a lowering in the probability of generation of defects. This is because the increase in the number of connection holes ensures that where, for example, at least two connection holes are provided for connection between the wirings, breakage of electric conduction would not be generated unless defects are simultaneously generated at two connection holes. Thus, the provision of a plurality of connection holes is effective for preventing the breakage trouble.

Figure 9:
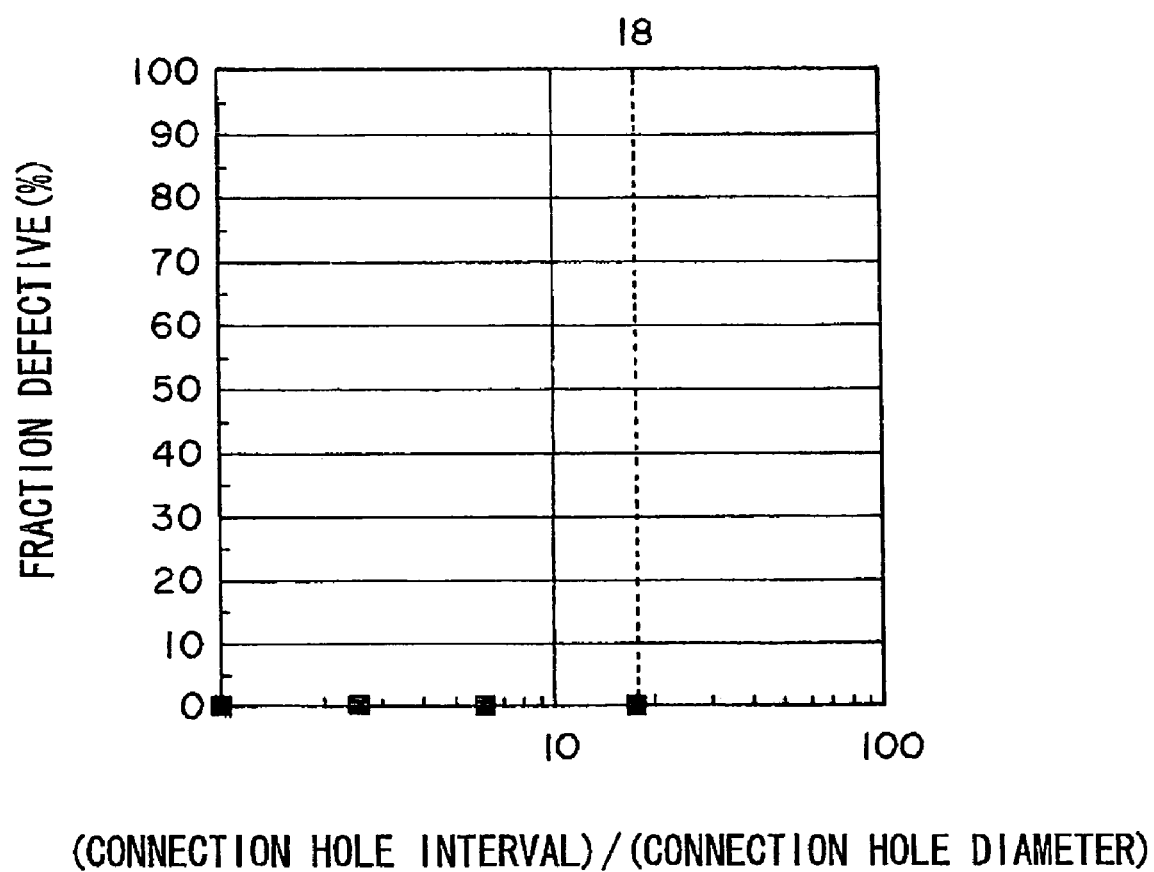
FIG. 9 is a diagram showing the relationship between fraction defective and the ratio of connection hole interval to connection hole diameter.

As has been described above, where a plurality of connection holes are provided, it is desirable that the connection holes are disposed within a predetermined interval. The reason is the same as has been described above referring to FIG. 9.

Figure 10:
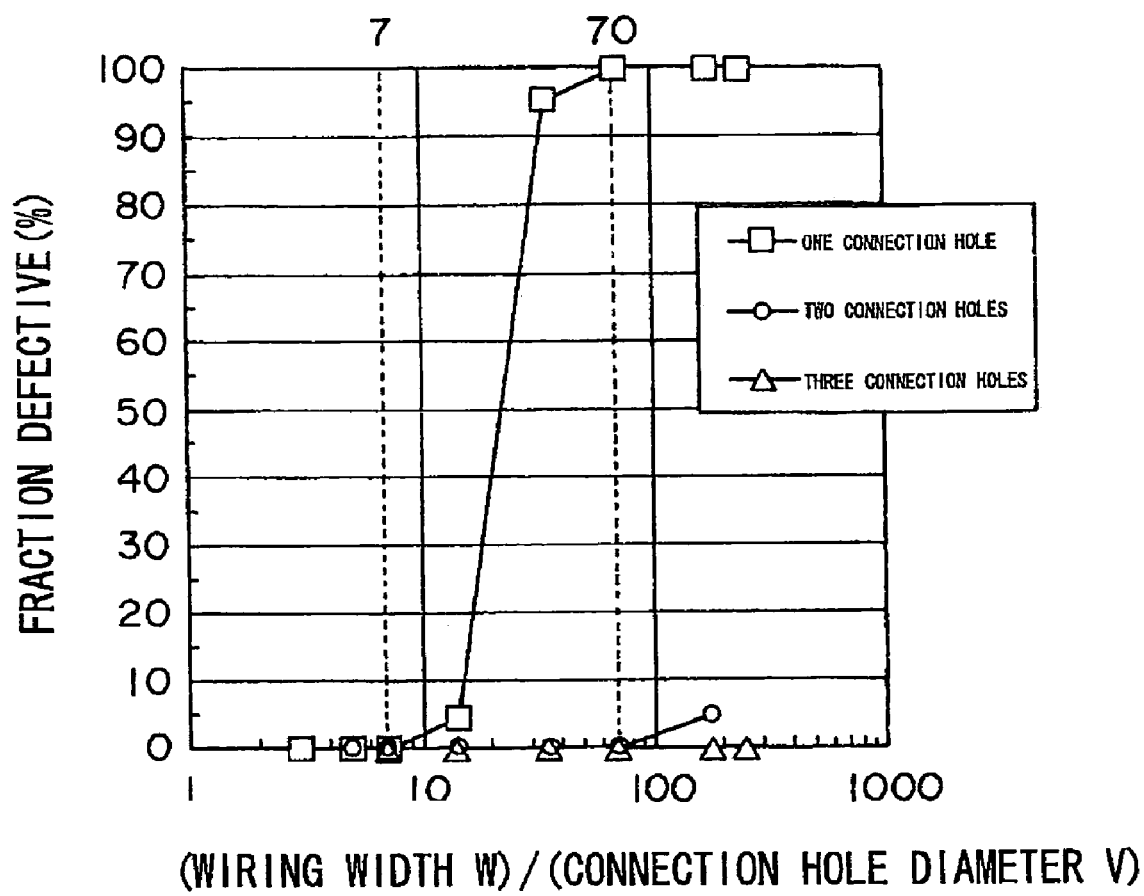
FIG. 10 is a diagram showing the relationship between the fraction defective and the ratio (W/V) of first wiring width (W) to connection hole diameter (V).

Besides, in the above semiconductor device, by optimizing the number of the connection holes, the volumetric shrinkage amount (which depends on the wiring width) can be absorbed, and the number of connection holes required for conduction is found out. The reason is as has been described above referring to FIG. 10. Namely, when the ratio W/V of wiring width (W) to connection hole diameter (V) exceeds 7, the defect upon the high-temperature standing test is generated where a single connection hole is only provided, but the generation of the defect can be restrained where two connection holes are provided. When the wiring width increases further and the ratio W/V of wiring width (W) to connection hole diameter (V) exceeds 70, the defect is generated even where two connection holes are provided, but the defect can be obviated by providing three connection holes. In this way, the defect upon the high-temperature standing test can be obviated by providing a plurality of connection holes according to the wiring width.

Next, a second embodiment of the semiconductor device according to the present invention will be described referring to a wiring layout diagram in FIG. 2. For simplicity of description, in the drawing, device regions, device isolation regions, inter-layer insulation films and the like are omitted, and only wirings are illustrated. Besides, the same component parts as those described referring to FIG. 1 are denoted by the same symbols as used above.

Figure 2:
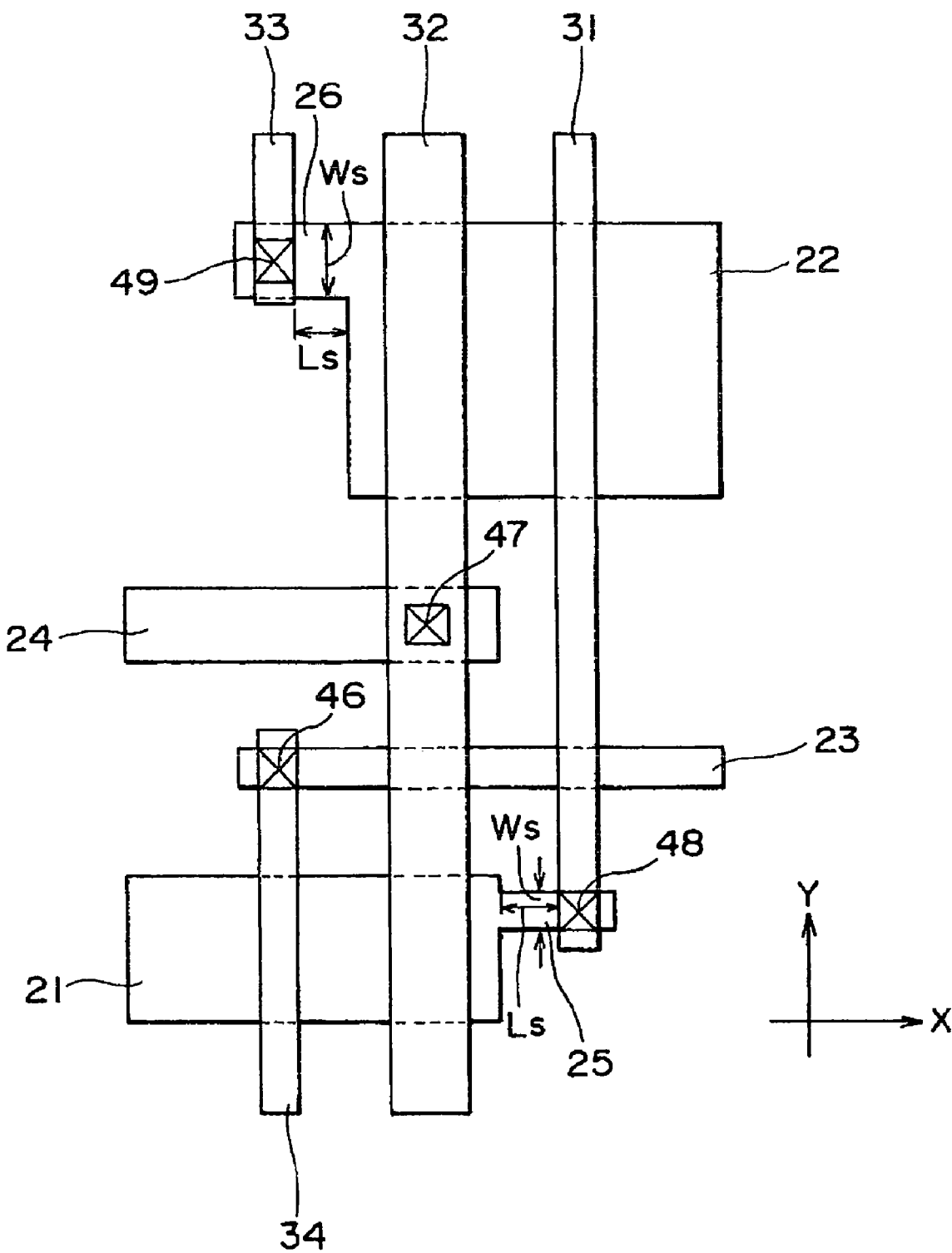
FIG. 2 is a wiring layout diagram showing a second embodiment of the semiconductor device according to the present invention.

As shown in FIG. 2, first wirings 21, 22, 23, and 24 of a first wiring layer are formed, for example in X direction, on a silicon substrate (not shown), with an insulation film (not shown) therebetween. The first wiring 21 is provided with a wiring 25 (hereinafter referred to as the narrow wiring 25) which is formed in continuity or connection with the first wiring 21 and which is smaller in width than the first wiring 21. In addition, the first wiring 22 is provided with a wiring 26 (hereinafter referred to as the narrow wiring 26) which is formed in continuity or connection with the first wiring 22 and which is smaller in width than the first wiring 22. Further, second wirings 31, 32, and 33 of a second wiring layer are formed, for example in Y direction, on the first wiring layer so as to cross the first wiring layer, with an inter-layer insulation film (not shown) therebetween.

In addition, the inter-layer insulation film formed between the first wiring layer and the second wiring layer is provided with a connection hole 48 for connection between the narrow wiring 25 and the second wiring 31, is provided with a connection hole 49 for connection between the narrow wiring 26 and the second wiring 33, is provided with a connection hole 46 for connection between the first wiring 23 and the second wiring 34, and is provided with a connection hole 47 for connection between the first wiring 24 and the second wiring 32. Each of the connection holes 46 to 49 is provided therein with an electrically conductive connection portion. Each of the connection holes 46 to 49 may be formed integrally with the relevant wiring, or may be formed separately from the relevant wiring. Here, it is assumed that each connection hole is formed integrally with the relevant wiring.

In the above wiring structure, let the wiring width of the narrow wirings 25 and 26 be Ws and let the diameter of the connection holes 48 and 49 be V, then it is necessary to satisfy the relationship of Ws/V<7, and, let the width of the narrow wiring 25 be Ws and let the distance from the first wiring 21 to the location of the connection hole 48 along the narrow wiring 25 be Ls, then the area S occupied by the region of the narrow wiring 25 ranging from the first wiring 21 to the connection hole 48 is Ws×Ls. Let the width of the first wiring 21 satisfying W/V≧7 be W, it is necessary to fulfill the relationship of W/S<143 $\mu m^{-1}$. For the narrow wiring 26, also, it is necessary to satisfy the relationship of W/V<143 $\mu m^{-1}$, where S is the area occupied by the region of the narrow wiring 26 ranging from the second wiring 22 to the connection hole 49, and W is the width of the first wiring 22 satisfying W/V≧7.

According to the above constitution, the second wiring can be connected to the first wiring which satisfies W/V≧7, via the single connection hole.

Besides, while the narrow wirings described above referring to FIG. 2 have been formed in a straight line form, they can be formed in a crooked line form. Such an example is illustrated referring to a wiring layout diagram in FIG. 3. For simplicity of description, in the drawing, device regions, device separation regions, inter-layer insulation films and the like formed in or on a silicon substrate are omitted, and only wirings are illustrated. In addition, the same component parts as those described above referring to FIG. 2 are denoted by the same symbols as used above.

Figure 3:
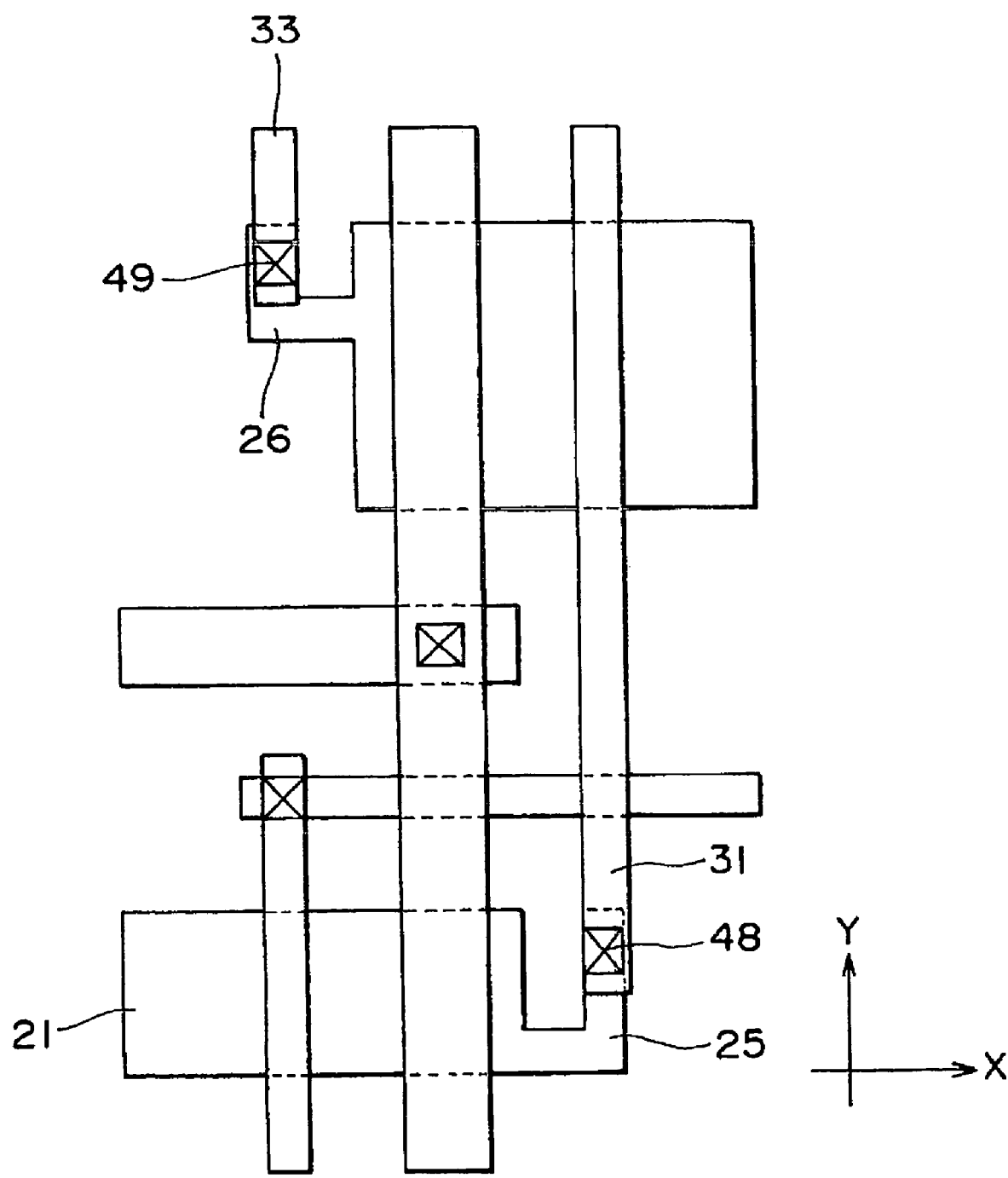
FIG. 3 is a wiring layout diagram showing a modification of the second embodiment of the semiconductor device according to the present invention.

As shown in FIG. 3, narrow wirings 25 and 26 formed in continuity or connection with first wirings 21 and 22 so wide that W/V≧7 are formed, for example, in an L-shaped crooked form, and connection holes 48 and 49 for connection to second wirings 31 and 33 are disposed at the tip portions of the crooked forms, respectively. In this case, also, it is necessary to satisfy the relationship of W/S<143 $\mu m^{-1}$. This constitution is effective in the case where a sufficient distance cannot be taken between the large-width first wiring and the connection hole.

Figure 4:
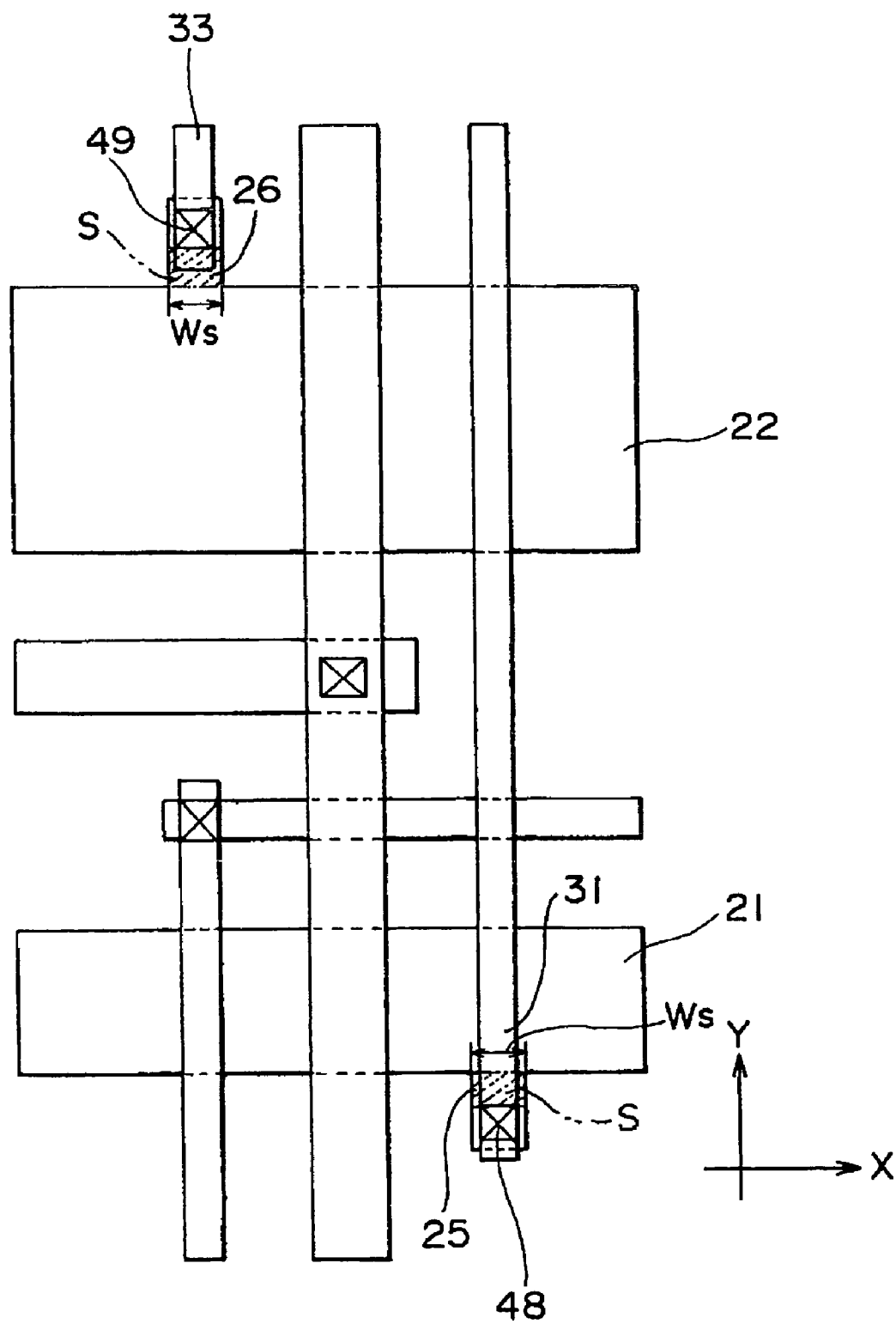
FIG. 4 is a wiring layout diagram showing another modification of the second embodiment of the semiconductor device according to the present invention.

In addition, as shown in FIG. 4, where a first wiring 21 is formed to extend in X direction, the narrow wiring 25 may be formed to extend in Y direction from a side portion of the first wiring 21. Therefore, a connection hole 48 is formed between the narrow wiring 25 and a second wiring 31. Similarly, where a second wiring 22 is formed to extend in X direction, the narrow wiring 26 may be formed to extend in Y direction from a side portion of the second wiring 22. Therefore, a connection hole 49 is formed between the narrow wiring 26 and a second wiring 33. In these cases, also, it is necessary to satisfy the relationships of Ws/V<7 and W/S<143 µm$^{-1}$, in the same manner as has been described above referring to FIG. 2.

Figure 11A:
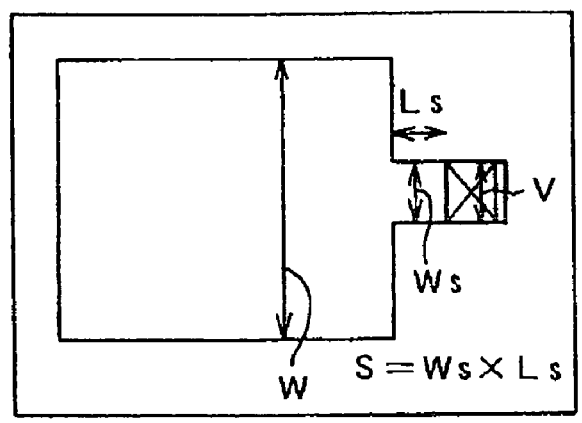
FIGS. 11A and 11B are diagrams showing the relationship between fraction defective and the ratio (W/S) of first wiring width (W) to the area (S) of the leader wiring portion ranging from the first wiring to the connection hole.
Figure 11B:
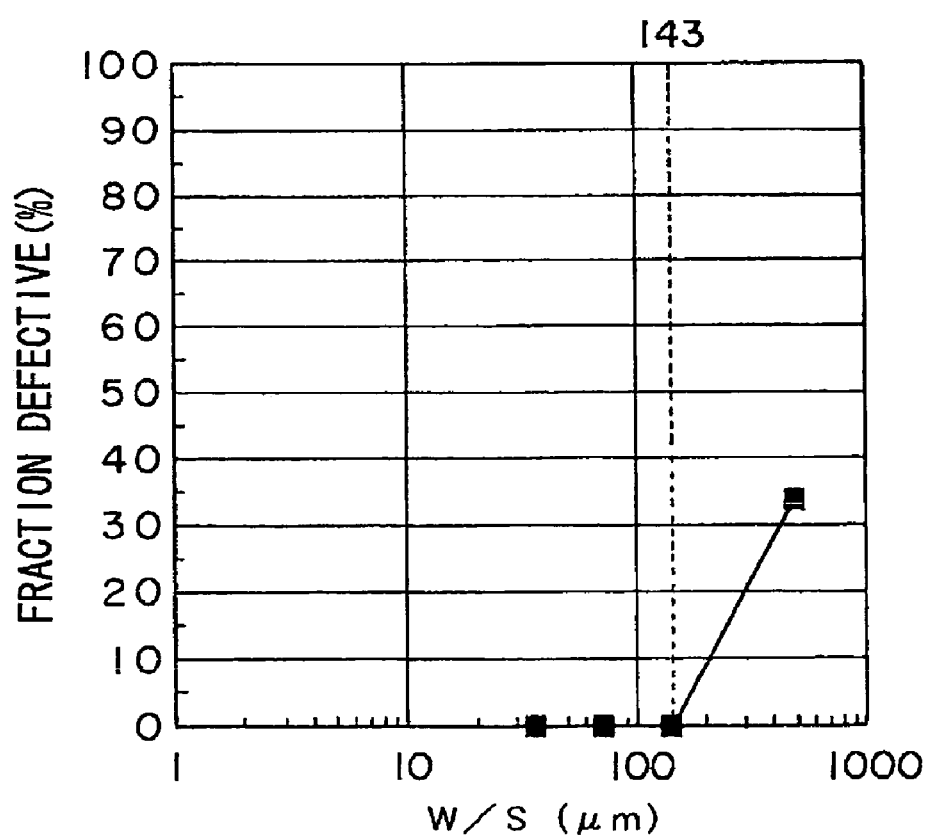
Figure 12:
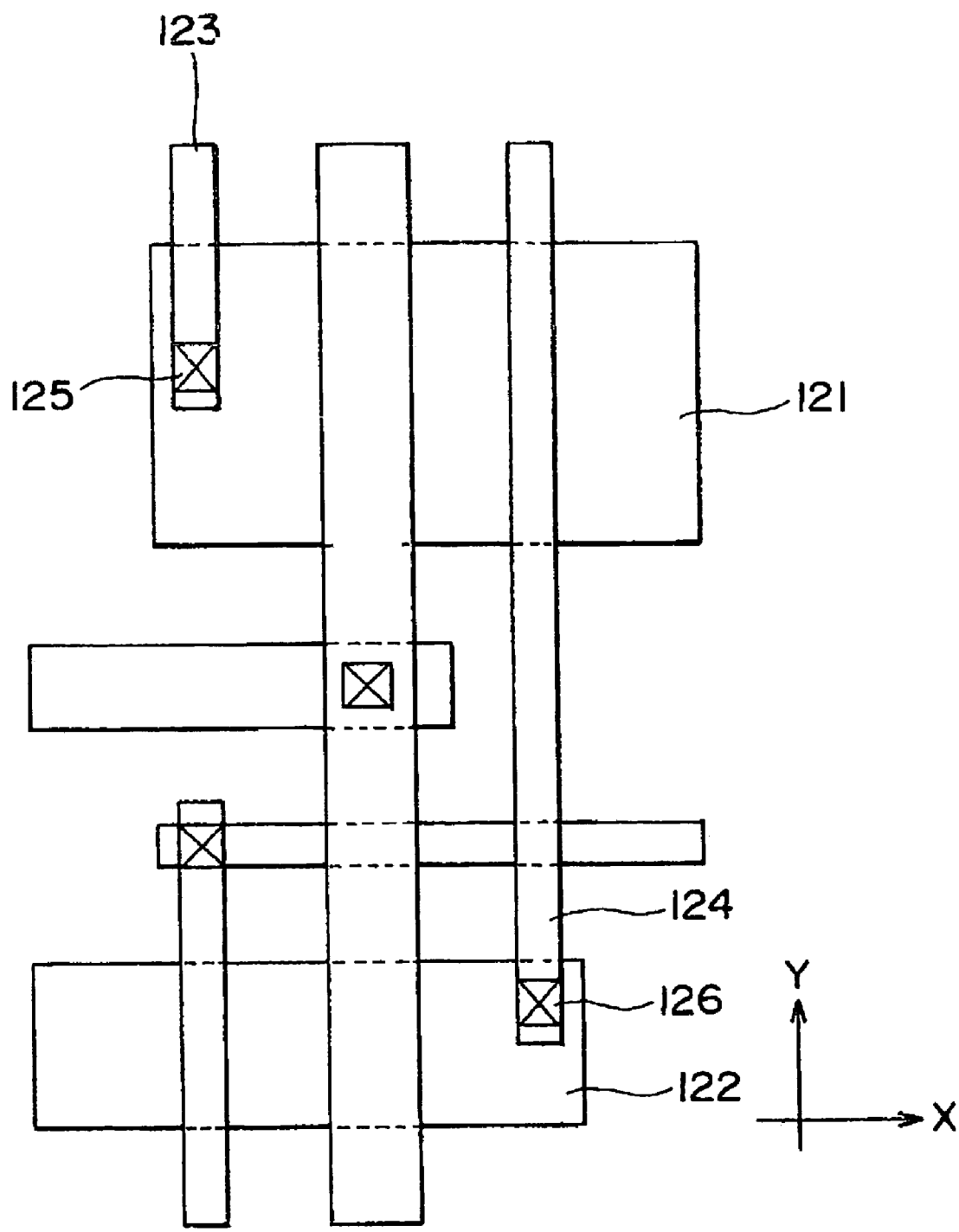
FIG. 12 is a wiring layout diagram showing a wiring connection structure in a semiconductor device according to the related art.
Figure 13:
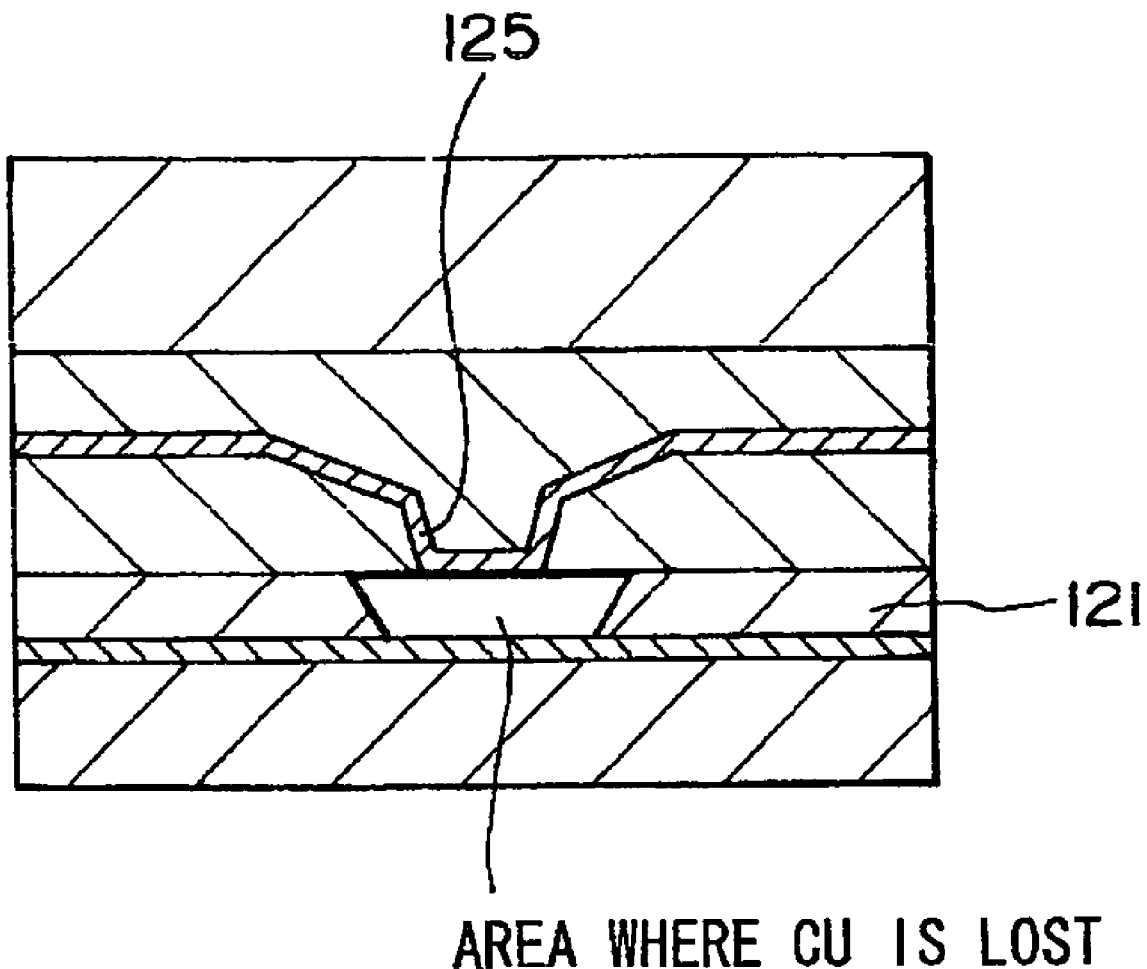
FIG. 13 is a schematic sectional view for illustrating the result of an analysis of a defective portion.
Figure 14:
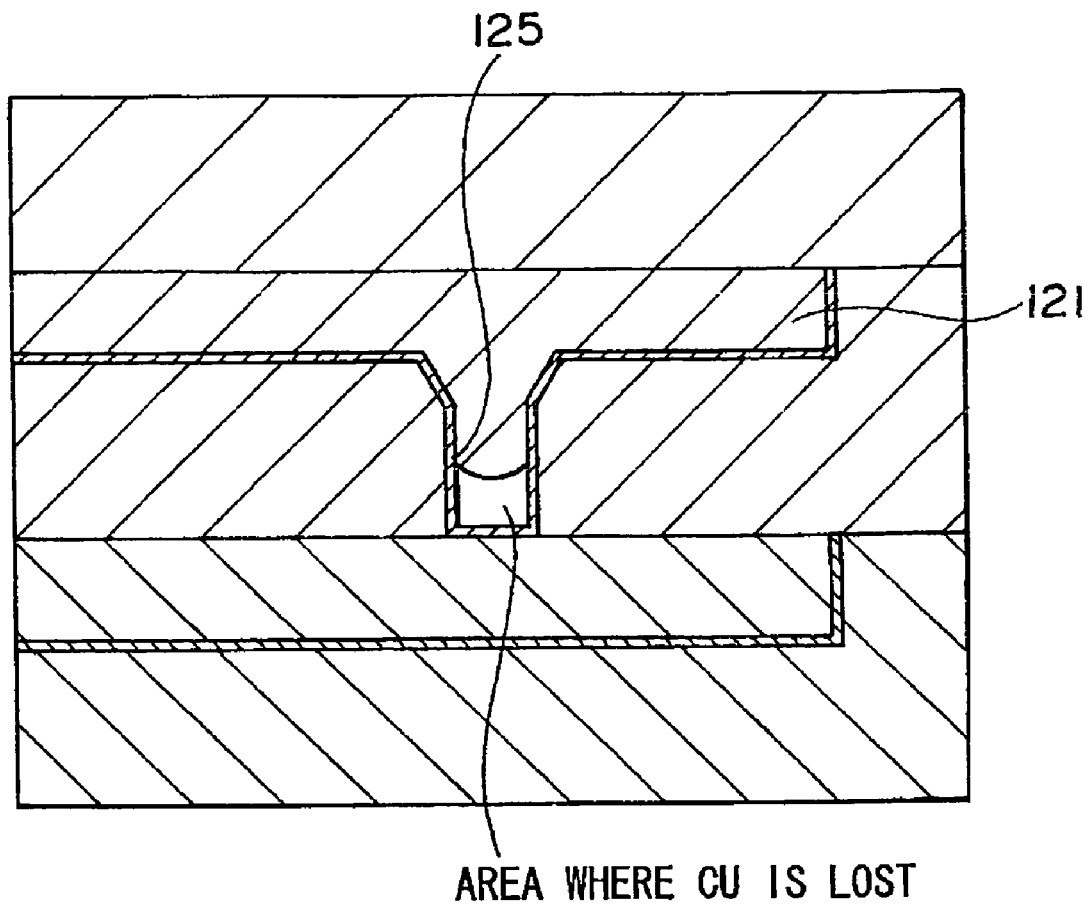
FIG. 14 is a schematic sectional view for illustrating the result of an analysis of a defective portion.

In the above semiconductor device, as a countermeasure for coping with the case where a connection hole cannot be disposed according to the wiring width, the second wiring is connected to a leader wiring portion which is formed in continuity with the first wiring and which is smaller in width than the first wiring, so that the problem which would otherwise be generated at the large-width wiring portion is obviated. The reason is the same as described above referring to FIGS. 11A and 11B; specifically, by such a setting that W/S≦143 µm$^{-1}$, generation of defects can be obviated even with a single connection hole. In this case, it is necessary that the width Ws of the narrow wiring portion smaller in width than the first wiring satisfies the relationship of Ws/V<7. The reason is as has been described above referring to FIG. 10.

In the next place, an embodiment of the method of manufacturing a semiconductor device according to the present invention will be described referring to manufacturing step sectional views in FIGS. 5A and 8B. In each of the manufacturing step diagrams, a section of the portion where the first wiring 21 and the second wiring 31 shown in FIG. 1 above cross each other, taken along the arrangement direction of the second wiring 31, is shown. The same component parts as those described referring to FIG. 1 above are denoted by the same symbols as used above.

Figure 5A:
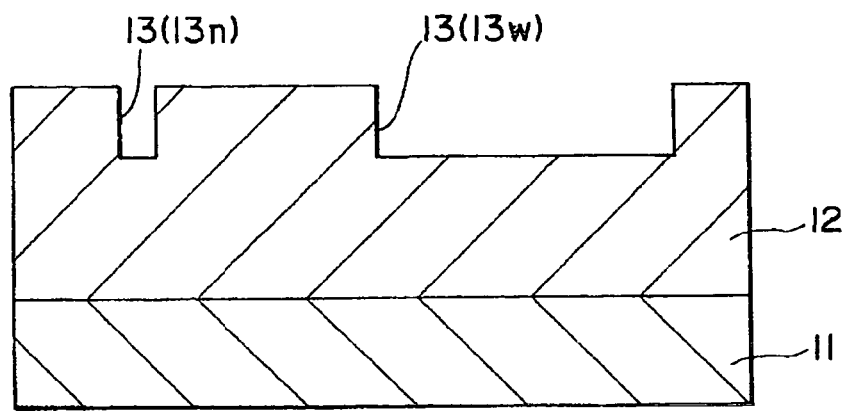
FIGS. 5A to 5C are manufacturing step sectional views for illustrating an embodiment of the method of manufacturing a semiconductor device according to the present invention.

As shown in FIG. 5A, a first insulation film 12 covering a substrate 11 provided, for example, with such devices as transistors, capacitors and the like which are not shown is formed. By lithography technique and etching technique, wiring trenches 13 having a depth of 200 nm, for example, are formed at portions where a first wiring layer is to be formed, of the first insulation film 13. Here, a wiring trench 13w for forming a wide wiring and a wiring trench 13n for forming a narrow wiring were formed.

Figure 5B:
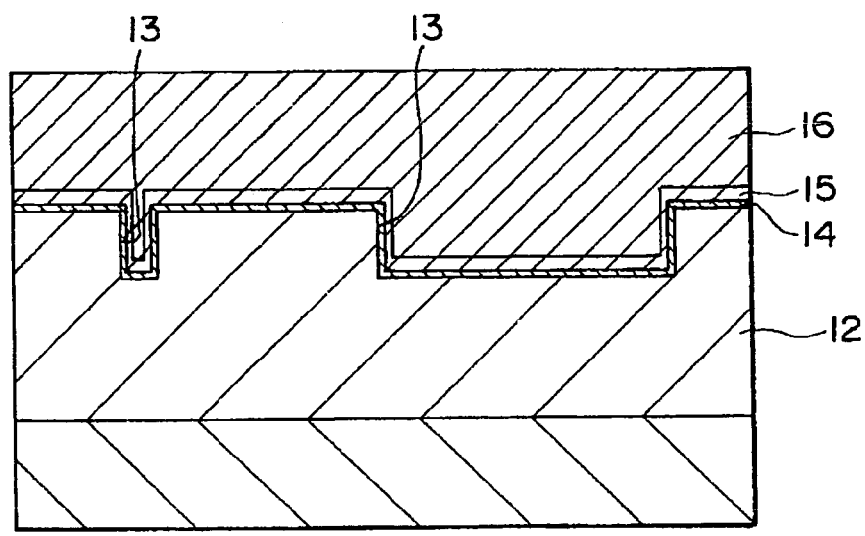

Next, as shown in FIG. 5B, a barrier layer 14 is formed on the surface of the first insulation film 12 and on the inside surfaces of the wiring trenches 13. The barrier layer 14 is formed, for example, by building up a tantalum (Ta) film in a thickness of 10 nm. Further, a copper (Cu) seed film 15 is formed, for example, by sputtering. The copper seed film 15 is formed, for example, by building up copper in a thickness of 80 nm. Next, electroplating is conducted to build up a copper (Cu) plating layer 16 on the first insulation film 12 in a thickness of, for example, 700 nm.

Figure 5C:
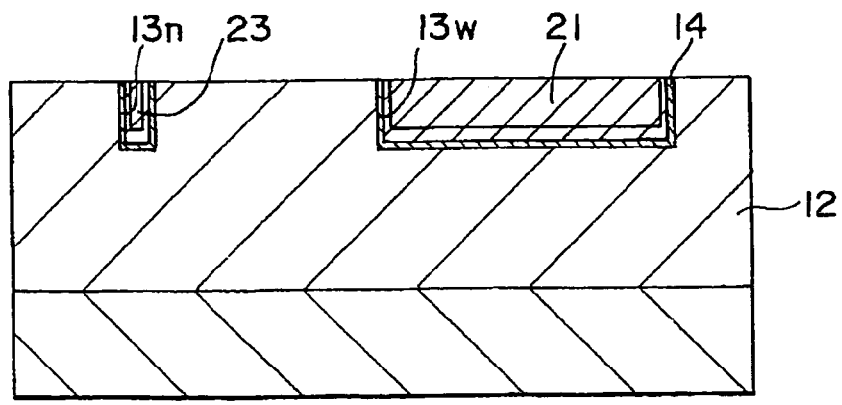

Subsequently, as shown in FIG. 5C, polishing by chemical mechanical polishing (hereinafter referred to as CMP) is conducted until the surface of the first insulation film 12 is exposed, whereby surplus copper and the barrier layer 14 on the surface of the first insulation film 12 are removed, leaving copper in the wiring trenches 13, with the barrier layer 14 therebetween, resulting in that a first wiring 21 of a first wiring layer is formed in the wiring trench 13w and a first wiring 23 is formed in the wiring trench 13n. FIGS. 5A to 8B pertaining to the description here show the width-direction sections of the first wirings 21 and 23. Of the first wirings formed in this manner, the first wiring 21 is a large-width wiring which satisfies the relationship of W/V≧7, where V is the diameter of the connection hole to be formed later, and W is the width of the first wiring 21. The first wiring 23 is a wiring which satisfies the relationship of W/V<7, where V is the diameter of the connection hole to be described later, and W is the width of the first wiring 23.

Figure 6A:
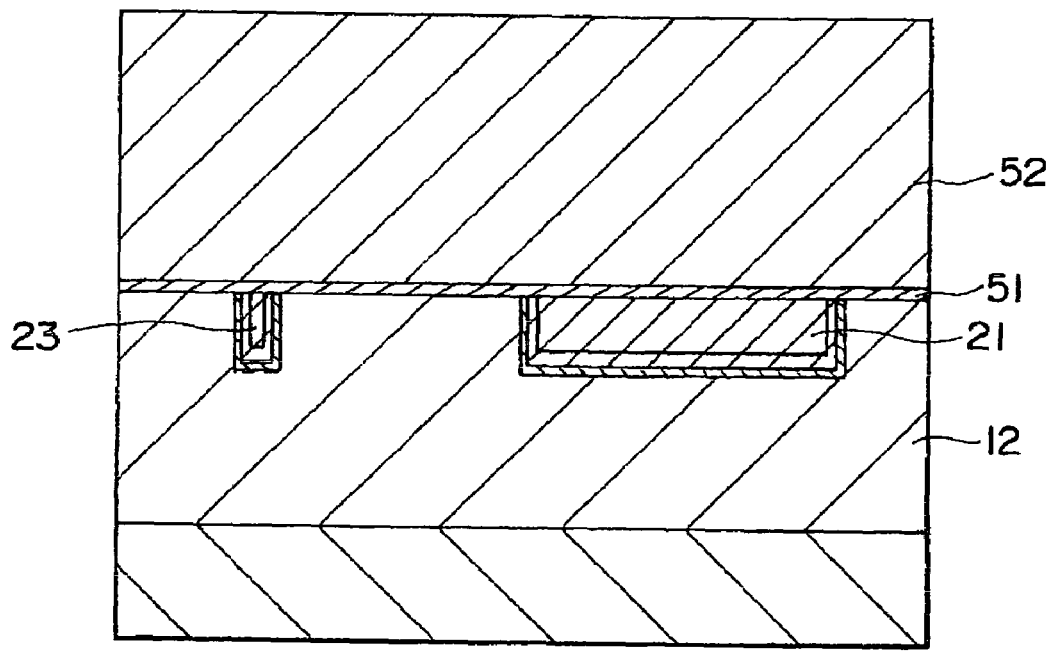
FIGS. 6A and 6B are manufacturing step sectional views for illustrating an embodiment of the method of manufacturing a semiconductor device according to the present invention.

Next, as shown in FIG. 6A, a copper diffusion preventive film 51 covering the first wiring 21 is formed on the first insulation film 12. The diffusion preventive film 51 is formed, for example, by forming a silicon carbide (SiC) film in a thickness of 50 nm. Thereafter, a second insulation layer 52 in which to form a second wiring layer is formed in a thickness of, for example, 600 nm, by use of, for example, a silicon oxide-based material or a low-dielectric-constant insulating material represented by polyaryl ether-based resins, silicon oxycarbide (SiOC) or the like.

Figure 6B:
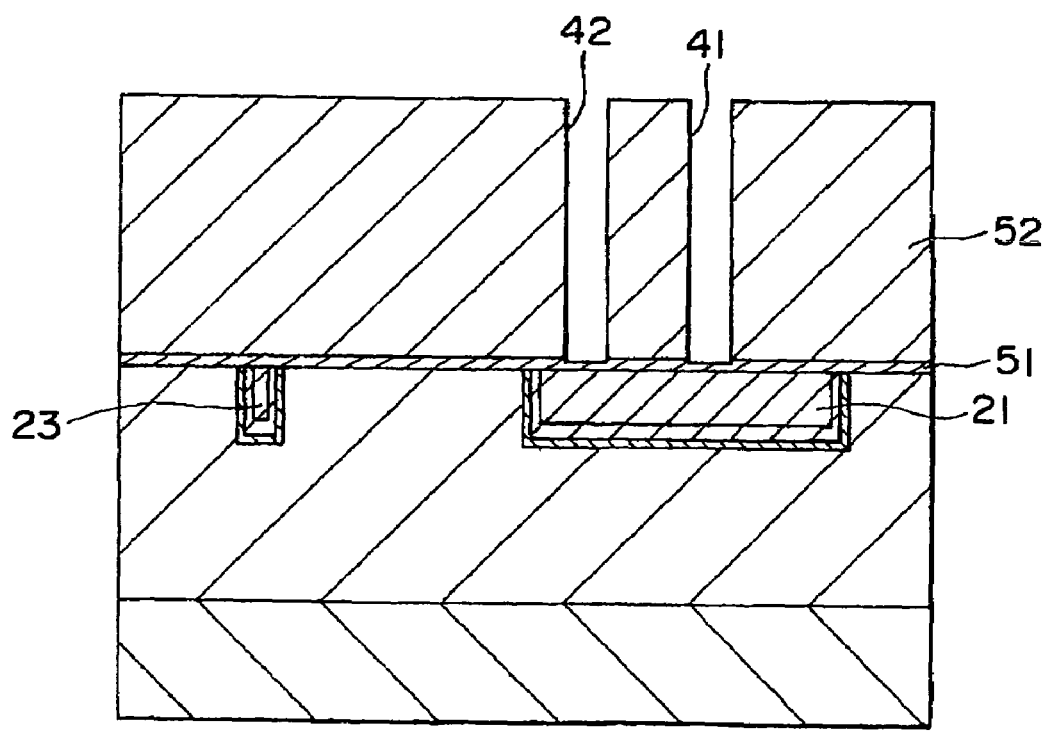

Subsequently, as shown in FIG. 6B, connection holes 41 and 42 reaching the first wiring 21 are formed by lithography technique and etching technique. In this case, it is desirable that the copper diffusion preventive film 51 is at least left at the bottom portions of the connection holes 41 and 42. In addition, the number of the connection holes between the first wiring layer and the second wiring layer is one where W/V<7, is two where 7≦W/V<70, and is three where 70≦W/V, where W is the width of the first wiring satisfying the relationship of W/V≧7, and V is the connection hole diameter. Besides, where a plurality of connection holes are formed for the first wiring 21 satisfying the relationship of W/V≧7, the connection holes are disposed at a connection hole interval within the range of from 1 to 18 times the connection hole. Incidentally, though not shown, a connection hole or holes for connection to the first wiring 23 are also formed simultaneously with the connection holes 41 and 42.

Figure 7A:
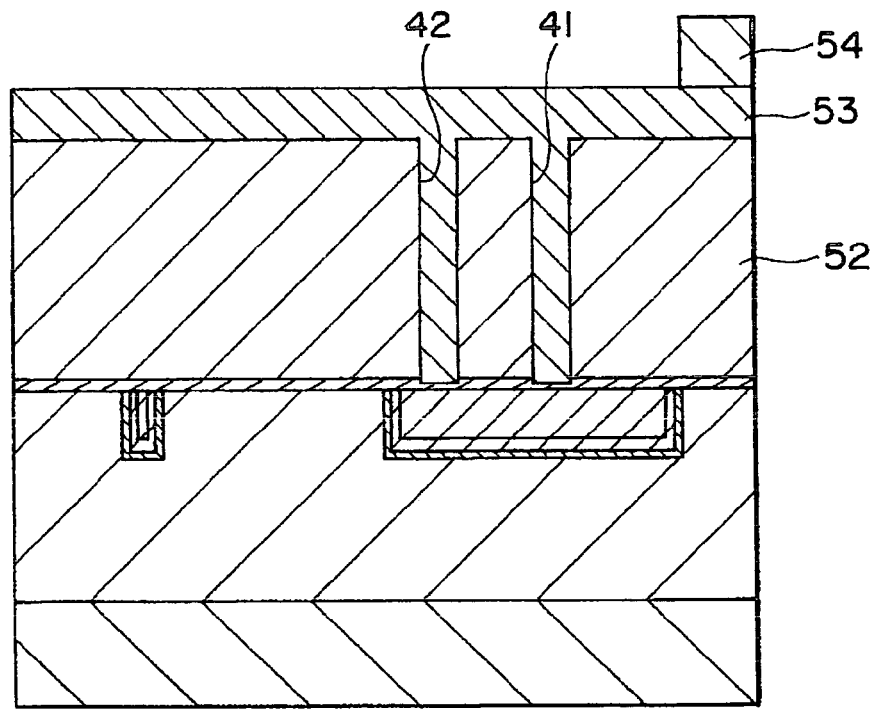
FIGS. 7A and 7B are manufacturing step sectional views for illustrating an embodiment of the method of manufacturing a semiconductor device according to the present invention.

Next, as shown in FIG. 7A, a filling material 53 making it possible to take an etching selectivity ratio between itself and the second insulation film 52 is applied to fill up the connection holes 41 and 42 by, for example, coating. In this case, the filling material 53 is formed also on the second insulation film 52. Thereafter, a resist is applied onto the filling material 53, and a resist pattern 54 opened in the region for forming a second wiring layer is formed by lithography technique.

Figure 7B:
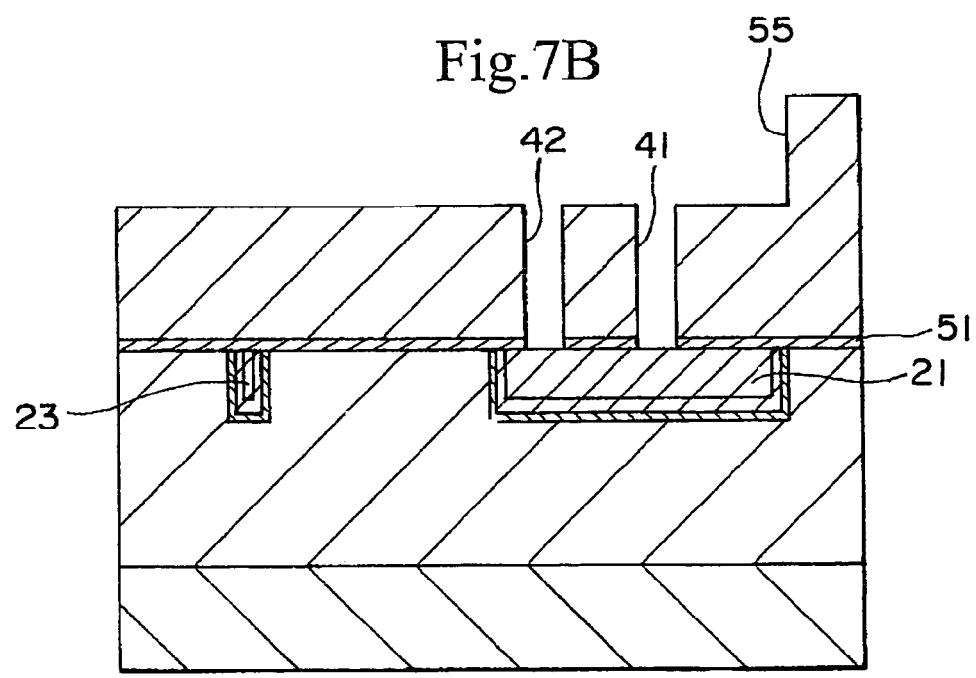

Subsequently, with the resist pattern 54 as a mask, the filling material 53 and the second insulation film 52 are processed by etching technique, to form wiring trenches (represented by a wiring trench 55 in the drawing) for formation of the second wiring layer and to reopen the connection holes for connection to the first wiring layer, as shown in FIG. 7B. In this case, the wiring trench 55 was processed to have a depth of 300 nm, for example. In the drawing, the connection holes 41 and 42 reaching the first wiring 21 are shown. Though not shown, the connection hole or holes reaching the first wiring 23 and a wiring trench for connection to the connection hole or holes are also formed simultaneously. In this instance, the diffusion preventive film 51 formed at the bottom portions of the connection holes 41 and 42 are also removed.

Figure 8A:
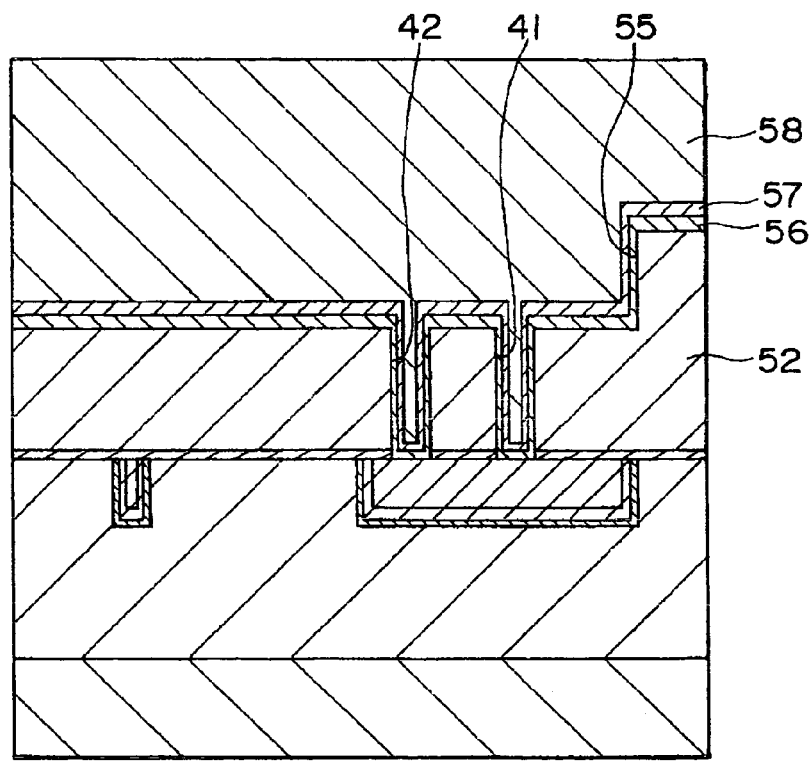
FIGS. 8A and 8B are manufacturing step sectional views for illustrating an embodiment of the method of manufacturing a semiconductor device according to the present invention.

Next, as shown in FIG. 8A, for formation of the second wiring layer, a barrier layer 56 is formed on the inside surfaces of the wiring trench 55, the inside surfaces of the connection holes 41 and 42, and on the second insulation film 52. The barrier layer 56 is formed, for example, by building up a tantalum (Ta) film in a thickness of 20 nm. Further, a copper (Cu) seed film 57 is formed, for example, by sputtering. The copper seed film 57 is formed by building up copper in a thickness of 80 nm, for example. Next, electroplating is conducted to form a copper (Cu) plating layer 58 on the first insulation film 12 in a thickness of, for example, 800 nm.

Figure 8B:
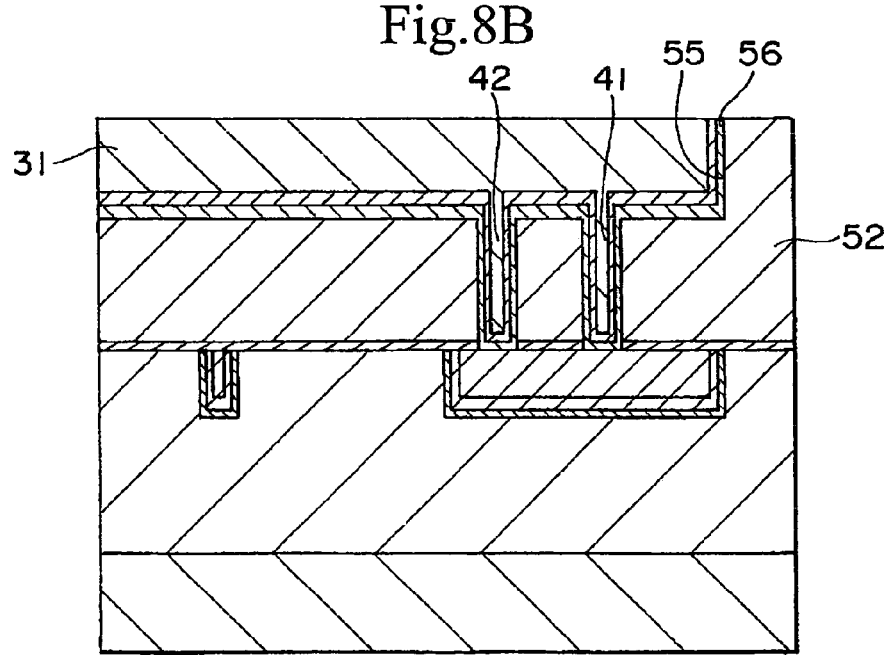

Subsequently, as shown in FIG. 8B, polishing by CMP technique is conducted until the surface of the second insulation film 52 is exposed, whereby surplus copper and the barrier layer 56 on the second insulation film 52 are removed, leaving copper in the wiring trench 55 and the connection holes 41 and 42, to form a second wiring 31 of the second wiring layer in the wiring trench 55 and in the connection holes 41 and 42. The second wiring 31 formed in this manner satisfies the relationship of W/V<7, where V is the diameter of the connection holes 41 and 42, and W is the width of the second wiring 31.

Thereafter, though not shown in the drawing, an insulation film and a wiring layer are formed in the same manner as above-described, whereby a multi-layer wiring can be formed.

In the manufacturing method described referring to FIGS. 5A to 8B above, in the case of forming the leader wirings 25 and 26 described above referring to FIGS. 2 to 4, the leader wirings 25 and 26 smaller in width than the first wirings 21 and 22 may be formed in continuity with the first wirings 21 and 22, together with the first wirings 21 and 22. In this case, paying attention to the first wiring 21, it is necessary to satisfy relationship of Ws/V<7, where Ws is the width of the leader wiring 25 and V is the diameter of the connection hole 48, and to satisfy the relationship of W/S<143 $\mu m^{-1}$, where S is the area occupied by the portion of the leader line 25 ranging from the first wiring 21 to the location of the connection hole 48, and W is the width of the first wiring 21 satisfying W/V≧7. In relation to the leader wiring 26 formed for the second wiring 22, also, it is necessary to satisfy the relationships of W/S<7 and W/S<143 $\mu m^{-1}$.

In the above method of manufacturing a semiconductor device, although the first wirings 21 and 22 are formed to be larger in width than the second wirings 31 and 33, the provision of the plurality of connection holes 41 to 45 makes it possible to manufacture a semiconductor device in which the probability of generation of defects at the connection hole portions is lowered. This is because the increase in the number of connection hole or holes ensures that where, for example, at least two connection holes are provided for connection between the wirings, breakage of electric conduction would not be generated unless defects are generated simultaneously at two connection holes. Thus, the provision of a plurality of connection holes is effective for preventing the breakage trouble.

In addition, where the plurality of the connection holes 41 and 42 and the connection holes 43 to 45 are provided, it is desirable that the connection holes are disposed within predetermined connection intervals. The reason is as has been described referring to FIG. 9 above.

In the above-described method of manufacturing a semiconductor device, the number of the connection holes formed is one where W/V<7, is two, where 7≦W/V<70, and is three where 70≦W/V, where W is the width of the first wiring, and V is the diameter of the connection holes. Therefore, by disposing the plurality of connection holes according to the wiring width, it is possible to obviate the defects upon the high-temperature standing test, as has been described referring to FIG. 10 above.

Besides, even in the manufacturing method in which the leader wirings continuous with the first wirings and smaller in width then the first wirings are formed and the connection holes are connected to the leader wirings, the problem which would be generated at the large-width wiring portions is obviated. In addition, since the relationship of Ws/V<7 and the relationship of W/V<143 $\mu m^{-1}$ are satisfied, the fraction defective upon the high-temperature standing test against W/S becomes zero (0), as has been described above referring to FIGS. 11A and 11B.

While an example of forming the large-width wirings on the lower layer side has been described in each of the modes for carrying out the present invention, the present invention can be applied in the same manner also to the case where the large-width wirings are provided on the upper layer side.

As has been described above, according to the semiconductor device of the present invention, by such a setting as to regulate the number of the connection holes for connection to the large-width wirings and to regulate the locations of the connection holes according to the wiring width, the phenomenon of losing of Cu which would otherwise be generated at the connection hole portions connected to the large-width wirings can be obviated, so that it is possible to provide a semiconductor device high in reliability. In addition, the two kinds of measures, i.e., the measure relating to the number of the connection holes and the measure relating to the side of the wirings for provision of the connection holes, as a countermeasure against the losing of Cu at the connection hole portions of the large-width wirings, produce the effect of minimizing the restrictions to LSI designing.

According to the method of manufacturing a semiconductor device of the present invention, by such a setting as to regulate the number of connection holes for connection to large-width wirings and to regulate the locations of the connection holes according to the wiring width, the phenomenon of losing of Cu which would otherwise be generated at the connection hole portions connected to the large-width wirings can be obviated, so that it is possible to manufacture a semiconductor device high in reliability. In addition, the two kinds of measures, i.e., the measure relating to the number of the connection holes and the measure relating to the side of the wirings for provision of the connection holes, as countermeasure against the losing of Cu at the connection holes portions of the large-width wirings, produce the effect of minimizing the restrictions to LSI designing.

The invention claimed is:

1. A semiconductor device comprising:
    a first wiring,
    an inter-layer insulation film covering said first wiring,
    a connection hole or holes formed in said inter-layer insulation film so as to reach said first wiring, and
    a second wiring connected to said first wiring through said connection hole or holes,
    said first wiring or said second wiring being formed to be larger in width than the other wiring, wherein
    the minimum required number of said connection holes
    is one where W/V<7,
    is two where 7≦W/V<70, and
    is three where 70≦W/V,
    where W is the width of said large-width wiring, and V is the diameter of said connection hole or holes.

2. A semiconductor device comprising:
    a first wiring,
    an inter-layer insulation film covering said first wiring,
    a connection hole or holes formed in said inter-layer insulation film so as to reach said first wiring, and
    a second wiring connected to said first wiring through said connection hole or holes,
    said first wiring or said second wiring being formed to be larger in width than the other wiring, wherein
    said semiconductor device comprises a leader wiring formed in continuation with said large-width wiring and smaller in width than said large-width wiring, and
    said connection hole or holes are formed in said inter-layer insulation film so as to reach said leader wiring.

3. The semiconductor device according to claim 2, wherein
    the relationship of Ws/V<7 is satisfied, where Ws is the width of said leader wiring, and V is the connection hole diameter, and the relationship of W/S<143 µ⁻¹ m is satisfied, where S is the area occupied by the leader wiring portion ranging from said large-width wiring to the location of said connection hole, and W is the width of said large-width wiring satisfying W/V≧7.

4. A method of manufacturing a semiconductor device, comprising the steps of:
forming a first wiring;
forming an inter-layer insulation film on said first wiring;
providing said inter-layer insulation film with a connection hole or holes reaching said first wiring; and
forming on said inter-layer insulation film a second wiring connected to said first wiring through the inside of said connection hole or holes,
said first wiring or said second wiring being formed to be larger in width than the other wiring, wherein
the number of said connection hole or holes
is one where W/V<7,
is two where 7≦W/V<70, and
is three where 70≦W/V,
where W is the width of said large-width wiring, and V is the connection hole diameter.

5. A method of manufacturing a semiconductor device, comprising the steps of:
forming a first wiring;
forming an inter-layer insulation film on said first wiring;
providing said inter-layer insulation film with a single connection hole reaching said first wiring; and
forming on said inter-layer insulation film a second wiring connected to said first wiring through the inside of said connection hole,
said first wiring or said second wiring being formed to be larger in width than the other wiring, wherein
a leader wiring smaller in width than said large-width wiring is formed in continuity with said large-width wiring, together with said large-width wiring, and
said leader wiring is formed on said inter-layer insulation film so as to be connected to said leader wiring through the inside of said connection hole.

6. The method of manufacturing a semiconductor device according to claim 5, wherein
the relationship of Ws/V<7 is satisfied,
where Ws is the width of said leader wiring, and V is the connection hole diameter, and
the relationship of W/S<143 µm⁻¹ is satisfied, where S is the area occupied by the leader wiring portion ranging from said large-width wiring to the location of said connection hole, and W is the width of said large-width wiring satisfying W/V≧7.

7. A semiconductor device comprising:
a first wiring,
an inter-layer insulation film covering said first wiring,
a connection hole or holes formed in said inter-layer insulation film so as to reach said first wiring, and
a second wiring connected to said first wiring through said connection hole or holes,
said first wiring or said second wiring being formed to be larger in width than the other wiring, wherein
said semiconductor device comprises a leader wiring formed in continuation with said large-width wiring and smaller in width than said large-width wiring; and
a plurality of said connection holes are provided at a connection hole interval within the range of from 1 to 18 times the connection hole diameter.

8. A semiconductor device comprising:
a first wiring,
an inter-layer insulation film covering said first wiring,
a connection hole or holes formed in said inter-layer insulation film so as to reach said first wiring, and
a second wiring connected to said first wiring through said connection hole or holes,
said first wiring or said second wiring being formed to be larger in width than the other wiring, wherein
the minimum required number of said connection holes
is one where W/V<7,
is two where 7≦W/V<70, and
is three where 70≦W/V,
where W is the width of said large-width wiring, and V is the diameter of said connection hole or holes, and
wherein said plurality of connection holes are disposed at a connection hole interval within the range of from 1 to 18 times the connection hole diameter.

9. A semiconductor device comprising:
a first wiring,
an inter-layer insulation film covering said first wiring,
a connection hole or holes formed in said inter-layer insulation film so as to reach said first wiring, and
a second wiring connected to said first wiring through said connection hole or holes,
said first wiring or said second wiring being formed to be larger in width than the other wiring, wherein
said semiconductor device comprises a leader wiring formed in continuation with said large-width wiring and smaller in width that said large-width wiring; and wherein
the minimum required number of said connection holes
is one where W/V<7,
is two where 7≦WN<70, and
is three where 70≦W/V,
where W is the width of said large-width wiring, and V is the diameter of said connection hole or holes and the relationship of Ws/V<7 is satisfied, where Ws is the width of said leader wiring, and V is the connection hole diameter.

10. The semiconductor device according to claim 9, wherein the relationship of W/S<143 µm⁻¹ is satisfied, where S is the area occupied by the leader wiring portion ranging from said large-width wiring to the location of said connection hole, and W is the width of said large-width wiring satisfying W/V≧7.

11. A method of manufacturing a semiconductor device, comprising the steps of:
forming a first wiring;
forming an inter-layer insulation film on said first wiring;
providing the inter-layer insulation film with a connection hole or holes reaching said first wiring; and
forming on the inter-layer insulation film a second wiring connected to said first wiring through the inside of said connection hole or holes,
said first wiring or said second wiring being formed to be larger in width than the other wiring,
forming a leader wiring smaller in width than said large-width wiring in continuity with said large width wiring, together with said large-width wiring, wherein
a plurality of said connection holes reaching said large-width wiring are provided at a connection hole interval within the range of from 1 to 18 times the connection hole diameter and the number of said connection hole or holes
is one where W/V<7,
is two where 7≦W/V<70, and
is three where 70≦W/V,
where W is the width of said large-width wiring, and V is the connection hole diameter.

12. A method of manufacturing a semiconductor device, comprising the steps of:

forming a first wiring;

forming an inter-layer insulation film on said first wiring;

providing said inter-layer insulation film with a single connection hole reaching said first wiring; and forming on said inter-layer insulation film a second wiring connected to said first wiring through the inside of said connection hole, said first wiring or said second wiring being formed to be larger in width than the other wiring, wherein a leader wiring smaller in width than said large-width wiring is formed in continuity with said large-width wiring, together with said large-width wiring, and said leader wiring is formed on said inter-layer insulation film so as to be connected to said leader wiring through the inside of said connection hole, and wherein the relationship of $W_s/V<7$ is satisfied, where $W_s$ is the width of said leader wiring, and V is the connection hole diameter, and the relationship of $W/S<143\ \mu m^{-1}$ is satisfied, where S is the area occupied by the leader wiring portion ranging from said large-width wiring to the location of said connection hole, and W is the width of said large-width wiring satisfying $W/V \geqq 7$.

* * * * *

UNITED STATES PATENT AND TRADEMARK OFFICE
CERTIFICATE OF CORRECTION

PATENT NO.         : 7,038,317 B2                                    Page 1 of 1
APPLICATION NO.    : 10/487440
DATED              : May 2, 2006
INVENTOR(S)        : Yoshiyuki Enomoto It is certified that error appears in the above-identified patent and that said Letters Patent is hereby corrected as shown below:

Column 13:
Line 1, "$\mu^{-1}$ m" should read -- $\mu m^{-1}$ --.

Column 14:
Line 28, "that" should read -- than --.

Signed and Sealed this

Nineteenth Day of December, 2006

JON W. DUDAS
*Director of the United States Patent and Trademark Office*